(12) United States Patent
Peng et al.

(10) Patent No.: US 8,916,469 B2
(45) Date of Patent: Dec. 23, 2014

(54) METHOD OF FABRICATING COPPER DAMASCENE

(71) Applicant: Taiwan Semiconductor Manufacturing Company, Ltd., Hsin-Chu (TW)

(72) Inventors: Chao-Hsien Peng, Zhubei (TW); Chi-Liang Kuo, Hsin-CHu (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/834,448

(22) Filed: Mar. 15, 2013

(65) Prior Publication Data

US 2014/0273434 A1    Sep. 18, 2014

Related U.S. Application Data

(60) Provisional application No. 61/777,689, filed on Mar. 12, 2013.

(51) Int. Cl.
| H01L 21/4763 | (2006.01) |
| H01L 21/44 | (2006.01) |
| H01L 29/40 | (2006.01) |
| H01L 21/768 | (2006.01) |

(52) U.S. Cl.
CPC ............................ *H01L 21/76841* (2013.01)
USPC ............ 438/643; 438/627; 438/653; 257/751

(58) Field of Classification Search
CPC ..... H01L 21/4763; H01L 21/44; H01L 21/28; H01L 29/40; H01L 23/48; H01L 23/52
USPC ......... 438/643–653, 622, 624, 627, 687, 703, 438/598, 618, 608, 633, 634; 257/753, 751, 257/738, 774, 763, 758, 737, 4, E45.002, 257/E21.58, E21.169, E21.226, E21.158, 257/E21.579, E21.577, E23.14, E21.252, 257/E23.011, E21.168, E21.576, E21.495, 257/E21.57, E23.021

See application file for complete search history.

(56) References Cited

U.S. PATENT DOCUMENTS

| 6,589,711 | B1 * | 7/2003 | Subramanian et al. ........ 430/311 |
| 2002/0001952 | A1 * | 1/2002 | Chooi et al. .................. 438/687 |
| 2003/0077897 | A1 * | 4/2003 | Tsai et al. ..................... 438/633 |
| 2004/0142561 | A1 * | 7/2004 | Wu et al. ........................ 438/687 |
| 2005/0153544 | A1 * | 7/2005 | Suh et al. ..................... 438/643 |
| 2005/0164487 | A1 * | 7/2005 | Seutter et al. ................. 438/653 |

(Continued)

*Primary Examiner* — Chuong A Luu
*Assistant Examiner* — Sheikh Maruf
(74) *Attorney, Agent, or Firm* — Slater & Matsil, L.L.P.

(57) ABSTRACT

A method of fabricating a semiconductor device includes forming a non-conductive layer over a semiconductor substrate. A low-k dielectric layer is formed over the non-conductive layer. The low-k dielectric layer is etched and stopped at the non-conductive layer to form an opening. A plasma treatment is performed on the substrate to convert the non-conductive layer within the opening into a conductive layer. The opening is filled with a copper-containing material in an electroless copper bottom up fill process to form a copper-containing plug. The copper-containing plug is planarized so that the top of the copper-containing plug is co-planar with the top of the low-k dielectric layer. The substrate is heated to form a self-forming barrier layer on the sidewalls of the copper-containing plug.

19 Claims, 7 Drawing Sheets

(56) References Cited

U.S. PATENT DOCUMENTS

| | | |
|---|---|---|
| 2006/0113675 A1* | 6/2006 | Chang et al. .................. 257/763 |
| 2008/0146015 A1* | 6/2008 | Usui et al. .................... 438/608 |
| 2008/0251921 A1* | 10/2008 | Besling ......................... 257/751 |
| 2012/0149168 A1* | 6/2012 | Helneder et al. ............... 438/382 |
| 2013/0230986 A1* | 9/2013 | Rajagopalan et al. ........ 438/682 |

* cited by examiner

METHOD OF FABRICATING COPPER DAMASCENE

This application claims the benefit of U.S. Provisional Application Ser. No. 61/777,689, filed on Mar. 12, 2013, entitled "Method of Fabricating Copper Damascene," which application is hereby incorporated herein by reference.

BACKGROUND

In semiconductor technology, an integrated circuit can be formed on a semiconductor substrate according to a particular technology node, which typically indicates a minimum feature size. When the minimum feature size moves to about 100 nm or below, damascene processes are frequently utilized to form multilayer copper interconnections including vertical interconnection vias and horizontal interconnection metal lines. As semiconductor device sizes continue to shrink, the damascene process will see a number of potential problems that may affect the quality of the interconnections. For example, in a 20-nanometer (nm) fabrication process, the openings may become too narrow and thus may not be properly filled by conventional damascene processes. The top portion of the opening may be blocked, which may create a void underneath that may degrade the performance of the semiconductor device. This problem is particularly acute in high aspect ratio features of small width.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
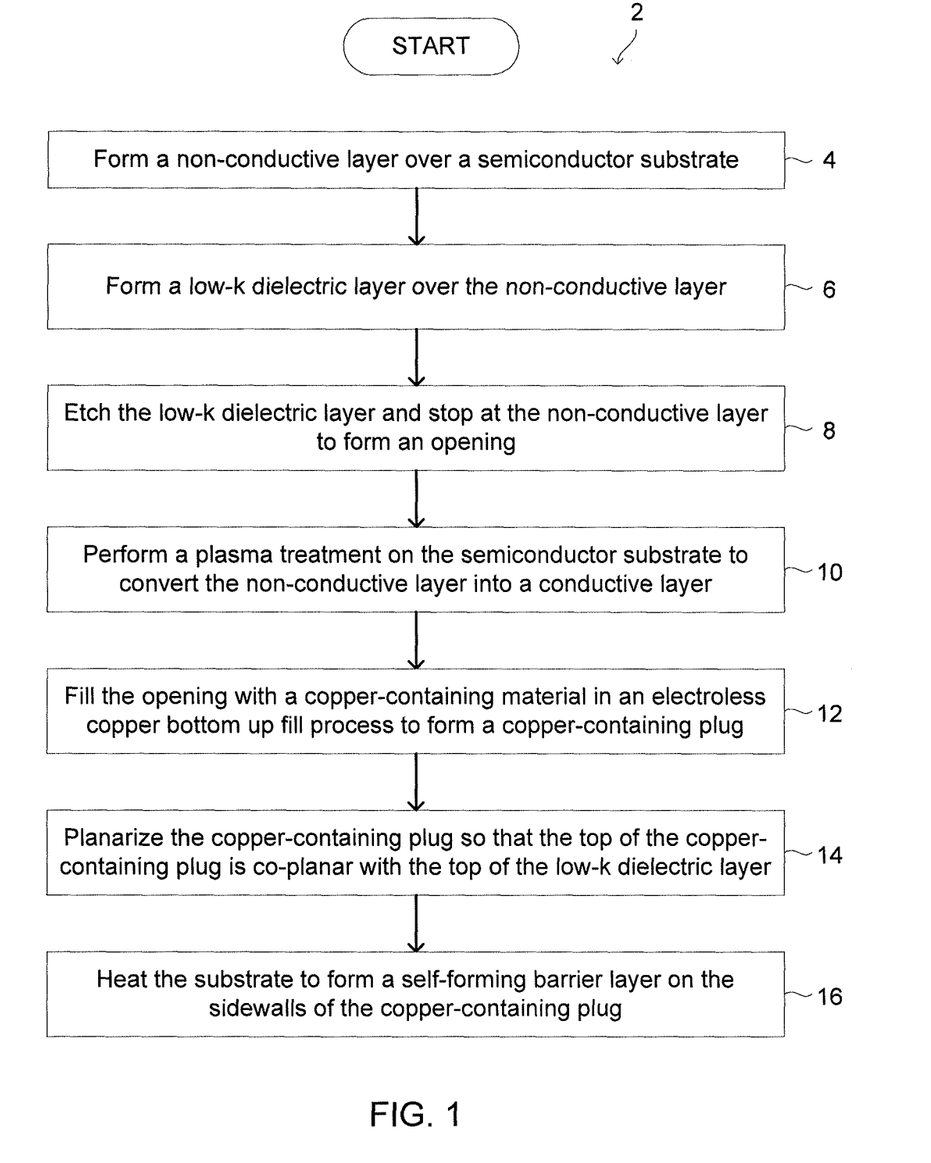
FIG. 1 is a flowchart of a method of fabricating a semiconductor device according to one embodiment of the present disclosure.

FIG. 1 is a flowchart of a method 2 for fabricating a semiconductor device according to various aspects of the present disclosure. Referring to FIG. 1, the method 2 includes block 4, in which a non-conductive layer is formed over a semiconductor substrate. The method 2 includes block 6, in which a low-k dielectric layer is formed over the non-conductive layer. The method 2 includes block 8, in which the low-k dielectric layer is etched and the etching stopping at the non-conductive layer to form an opening. The method 2 includes block 10, in which a plasma treatment is performed on the semiconductor substrate to convert the non-conductive layer into a conductive layer. The method 2 includes block 12, in which the opening is filled with a copper-containing material in an electroless copper bottom up fill process to form a copper-containing plug. The method 2 includes block 14, in which the copper-containing plug is planarized so that the top of the copper-containing plug is co-planar with the top of the low-k dielectric layer. The method 2 includes block 16, in which the semiconductor substrate is heated to form a self-forming barrier layer on the sidewalls of the copper-containing plug.

It is understood that additional processes may be performed before, during, or after the blocks 4-16 shown in FIG. 1 to complete the fabrication of the semiconductor device, but these additional processes are not discussed herein in detail for the sake of simplicity.

FIGS. 2-7 are diagrammatic fragmentary cross-sectional side views of a semiconductor device at various fabrication stages according to one embodiment of the method 2 of FIG. 1. It is understood that FIGS. 2-12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
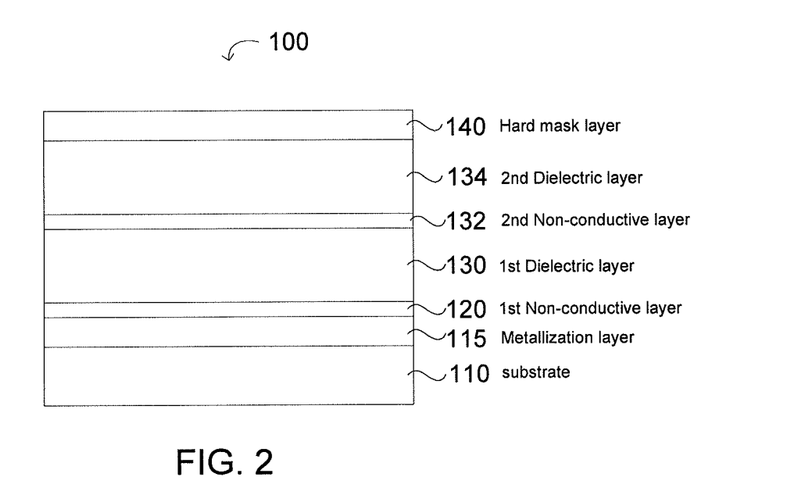
FIGS. 2-7 are diagrammatic cross-sectional side views of a portion of a semiconductor device at various stages of fabrication according to one embodiment of the present disclosure.

Referring to FIG. 2, a semiconductor device 100 is provided. The semiconductor device 100 may be an integrated circuit (IC) chip, system on chip (SOC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The semiconductor device 100 includes a substrate 110. The substrate 110 may be a portion of a semiconductor wafer. For example, the substrate may include silicon. The substrate 110 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 110 includes various doped features for various microelectronic components, such as a complementary metal oxide semiconductor field-effect transistor (CMOSFET), imaging sensor, memory cell, and/or capacitive element.

In some embodiments, a metallization layer 115 is formed in a dielectric layer (not shown) on the substrate 110. The metallization layer 115 is a conductive layer and may be a first metal layer in the semiconductor device 100. In an embodiment, the metallization layer 115 includes a material containing copper.

According to an aspect of the present disclosure, a first non-conductive layer 120 is formed on the substrate 110. The first non-conductive layer 120 may be a barrier layer, and hence is alternatively referred to as first barrier layer 120. Alternatively, the first non-conductive layer 120 may be an etch stop layer. In damascene applications where the underlying layer is a low-k dielectric layer, the first barrier layer 120 is deposited to prevent diffusion of copper, aluminum or other metal into the underlying low-k dielectric layer(s). The barrier layer also serves as a nucleation layer on which the copper in an electroless bottom up fill process is grown. As the name implies, the first non-conductive layer 120 is non-conductive; however, in a later plasma treatment process, the first non-conductive layer 120 will be converted into a conductive layer for forming copper plugs in an electroless copper bottom up fill process.

In an embodiment, the first non-conductive layer 120 is a material selected from the group consisting of TaN, TaSiN, TaC, TiN, TiSiN, AlON, AlN, and AlO. Other suitable materials that are non-conductive may also be used. In an embodiment, the first non-conductive layer 120 is formed on the substrate 110 by a chemical vapor deposition (CVD) process. In another embodiment, the first non-conductive layer 120 is formed by an atomic layer deposition (ALD) process. Other suitable deposition processes may also be used. In an exemplary embodiment, the first non-conductive layer 120 has a thickness from about 10 angstroms and about 100 angstroms.

Still referring to FIG. 2, a first dielectric layer 130 is formed over the first non-conductive layer 120. The first dielectric layer 130 may be formed by suitable deposition processes such as, for example CVD, PVD, or spin-on coating. The first dielectric layer 130 includes a low-k material in an embodiment, for example, a compound made of a subset of the following elements: Si, O, C, and H. For example, the compound may be silicon oxide or silicon carbide. In an embodiment, the first dielectric layer 130 has a thickness that is less than about 1,000 angstroms.

A second non-conductive layer 132 is formed over the first low-k dielectric layer 130. The second non-conductive layer 132 may be a barrier layer, and hence is alternatively referred to as second barrier layer 132. Alternatively, the second non-conductive layer 132 may be an etch stop layer. In damascene applications where the underlying layer is a low-k dielectric layer, the second barrier layer 132 is deposited to prevent diffusion of copper, aluminum or other metal into the underlying low-k dielectric layer, such as first dielectric layer 130. As the name implies, the second non-conductive layer 132 is non-conductive; however, in a later plasma treatment process, the second non-conductive layer 132 will be converted into a conductive layer for forming copper plugs in an electroless copper bottom up fill process.

In an embodiment, the second non-conductive layer 132 is a material selected from the group consisting of TaN, TaSiN, TaC, TiN, TiSiN, AlON, AlN, and AlO. Other suitable materials that are non-conductive may also be used. In an embodiment, the second non-conductive layer 132 is formed on the first dielectric layer 130 by a chemical vapor deposition (CVD) process. In another embodiment, the second non-conductive layer 132 is formed by an atomic layer deposition (ALD) process. Other suitable deposition processes may also be used. In an exemplary embodiment, the second non-conductive layer 132 has a thickness from about 10 angstroms to about 100 angstroms.

Still referring to FIG. 2, a second dielectric layer 134 is formed over the second non-conductive layer 132. The second dielectric layer 134 may be formed by suitable processes such as, for example CVD, PVD, or spin-on coating processes. The second dielectric layer 134 includes a low-k material in an embodiment, for example, a compound made of a subset of the following elements: Si, O, C, and H. For example, the compound may be silicon oxide or silicon carbide. In an embodiment, the second dielectric layer 134 has a thickness that is less than about 1,000 angstroms.

A deposition process is performed to form a hard mask layer 140 over the second dielectric layer 134. In one embodiment, the hard mask layer 140 includes a photoresist material. In another embodiment, the hard mask layer 140 includes a dielectric material, for example silicon oxide, which can be patterned by a patterned photoresist layer. The hard mask layer 140 is used in a later process as an etching mask to form openings in the first dielectric layer 130 and the second dielectric layer 134.

Figure 3:
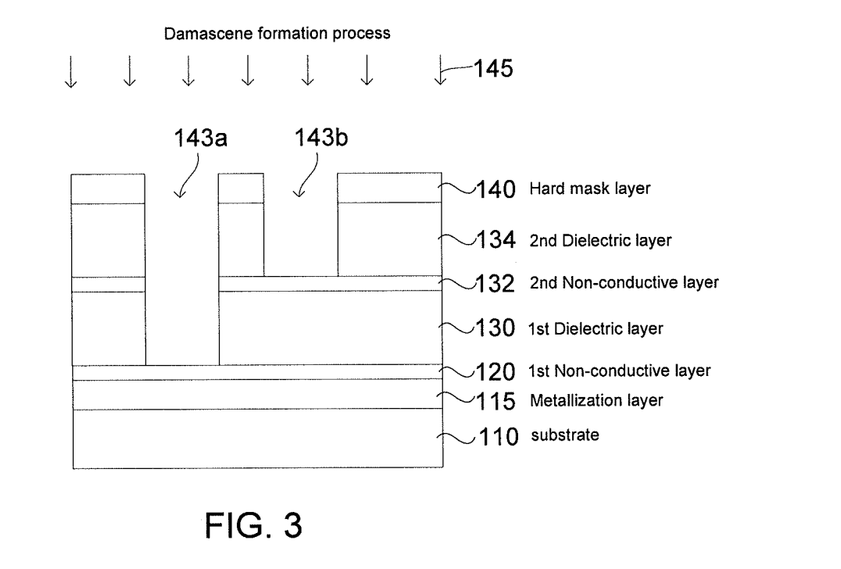

Referring now to FIG. 3, a damascene formation process 145 is performed on the semiconductor device 100 to form a plurality of openings in the hard mask layer 140, the second dielectric layer 134, the second non-conductive layer 132, and the first dielectric layer 130. In the embodiment shown in FIG. 3, a first opening 143a is formed in first dielectric layer 130 and second dielectric layer 134 and a second opening 143b is formed in second dielectric layer 134 but not in the first dielectric layer 130. In other embodiments, a single damascene opening may be formed. The damascene formation process 145 may include using a process such as photolithography, immersion lithography, ion-beam writing, or other suitable processes. For example, the photolithography process may include spin-coating, soft baking, exposure, post-baking, developing, rinsing, drying, and other suitable processes. The damascene formation process 145 includes an etching process in which the patterned hard mask layer 140 is used as a mask to etch the openings in the dielectric layers. For example, both the second dielectric layer 134 and the first dielectric layer 130 are etched, with the etching stopping at the first non-conductive layer 120 to form first opening 143a, and the second dielectric layer 134 is etched, the etching stopping at the second non-conductive layer 132 to form second opening 143b.

For the sake of simplicity, only first opening 143a and second opening 143b are illustrated herein, though it is understood that many other openings may be formed. Each of the openings 143a and 143b is approximately aligned (vertically) with a respective one of a portion of the metallization layer 115. Those skilled in the art will recognize that although metallization layer 115 is shown as a continuous layer for simplicity, in actual practice, metallization layer 115 will be patterned into numerous individual regions.

Figure 4:
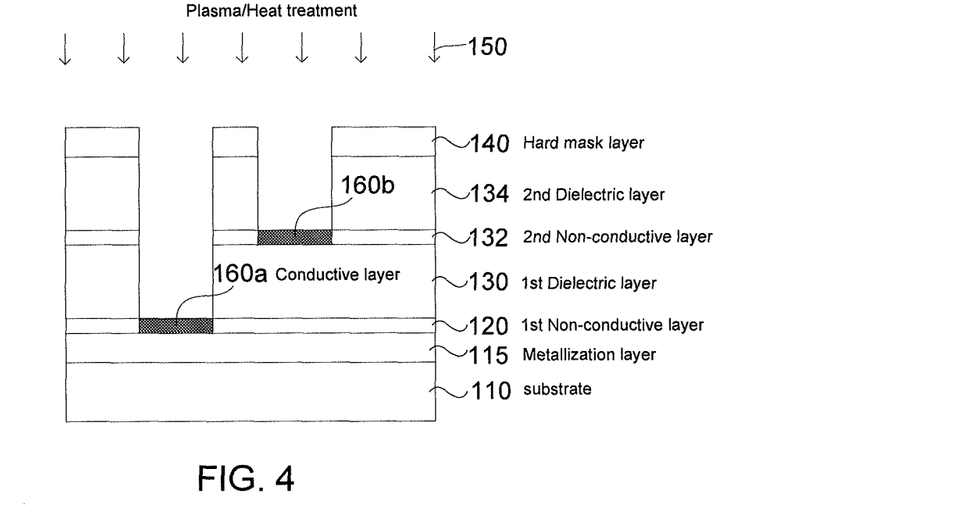

With reference to FIG. 4, a plasma/heat treatment 150 is performed on the semiconductor device 100 to convert the first non-conductive layer 120 within the first opening 143a into a first conductive layer 160a, and to convert the second non-conductive layer 132 within the second opening 143b into a second conductive layer 160b. The heat of the plasma converts the TaN in the first and second non-conductive layers 120 and 132, respectively from a non-conductive N rich layer to a conductive Ta rich layer. In an exemplary embodiment, the heat treatment is performed with a plasma gas selected from the group consisting of Ar, H2, He, Ne or mixtures thereof. In one embodiment, the heat treatment is performed at a temperature ranging between about 20 Celsius and about 400 Celsius, at a pressure ranging between about 0.01 torr and about 100 torr at a power ranging between about 50 watts and about 500 watts, and a time of between 3 seconds and 30 seconds. Those skilled in the art will recognize that the first non-conductive layer 120 can be converted into first conductive layer 160 by other heat treatments, such as for example, rapid anneal and pulsed beam (e.g., laser).

Figure 5:
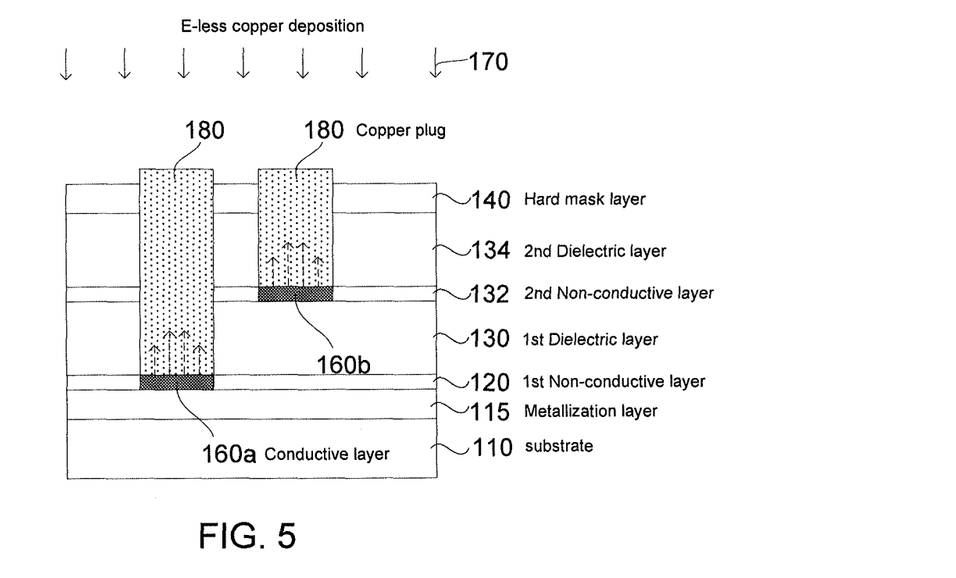

With reference to FIG. 5, a damascene deposition process 170 is performed on the semiconductor device 100. The damascene deposition process 170 deposits a conductive material in openings 143a and 143b. In one embodiment, the damascene deposition process 170 includes an electroless copper bottom-up fill process. With conventional copper deposition processes, the top portion of the opening may be blocked, thereby creating a void underneath the opening that may degrade the performance of the semiconductor device. In an electroless copper bottom up fill process, the void is avoided.

Figure 6:
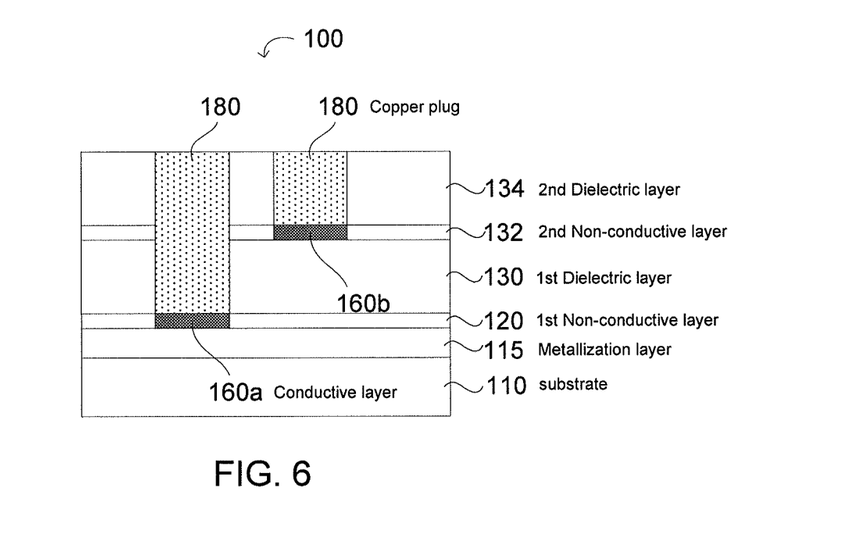

In the electroless copper bottom-up fill process, the process includes contacting first opening 143a and second opening 143b with an electroless plating bath and allowing electroless deposition of a conductive material to proceed for a predetermined time. One skilled in the art understands the composition of the electroless plating bath for copper filling and that it may include, for example a reducing agent, a surfactant, and a source of copper ions. In one embodiment, the electroless plating bath includes metal sources, reducing agents, buffer agents, and additives and the conductive material includes one of CuMn, CuCr, CuV, CuTi, and/or CuNb. According to one embodiment, the openings 143a and 143b are subject to the electroless plating bath for a period from about 100 seconds to about 5,000 seconds. Thereafter, the substrate is removed from the electroless plating bath. The process of contacting the openings to the electroless plating bath and removing the substrate therefrom is repeated to at least partially fill the openings 143a and 143b with a conductive material. As a result of the damascene deposition process 170, copper-containing plugs 180 are formed in the openings 143a and 143b. A planarization step using, for example a chemical mechanical polishing (CMP) process is subsequently performed after the damascene deposition process 170 to planarize the copper-containing plugs 180 so that the top thereof is co-planar with the top of the second low-k dielectric layer 134. The semiconductor device 100 after the step of planarization is shown in FIG. 6.

Figure 7:
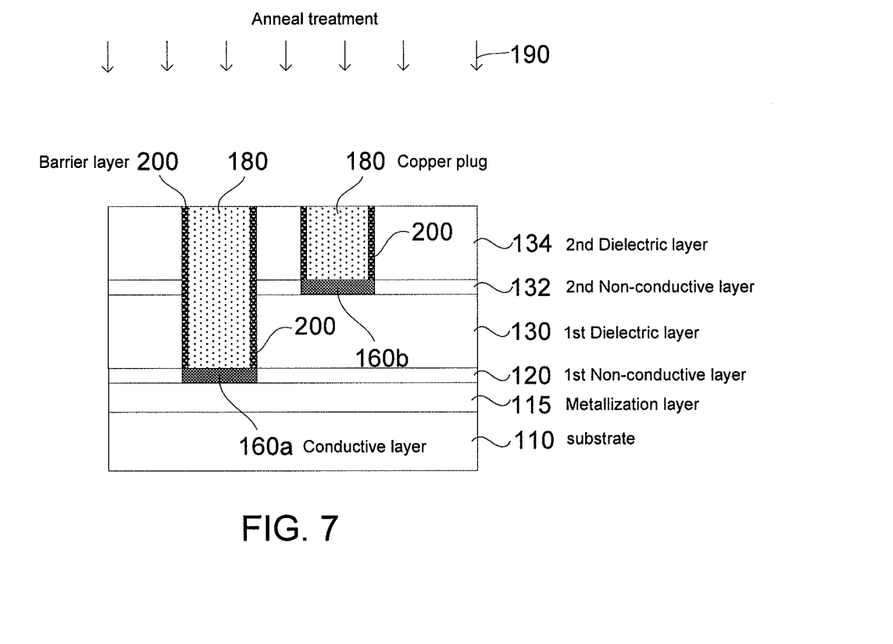

FIG. 7 shows a self-forming barrier layer 200 formed on the sidewalls of the copper-containing plugs 180. The self-forming barrier layer 200 includes metals and is electrically conductive but does not permit inter-diffusion and reactions between the copper-containing plugs 180 and the surrounding dielectric layer, such as first dielectric layer 130 and second dielectric layer 134. In one embodiment, an anneal treatment 190 is applied to the substrate to form a self-forming barrier layer 200 wrapping around the copper-containing plugs 180. The anneal treatment may be a rapid thermal anneal (RTA), a laser anneal, and/or a flash lamp anneal. In one embodiment, the barrier layer 200 is self-formed by applying a temperature from about 200 C to about 400 C to the substrate 110 for a time period of about 1 minute. The anneal process may be conducted in an oxygen ambient, a combination of steam ambient and oxygen ambient combined, or under an inert gas atmosphere. In one embodiment where the alloy element in the copper plug 180 manganese (Mn), with the thermal driving force, Mn segregates from copper and is driven to about the surfaces of the copper plug 180 where Mn reacts with oxygen to form manganese oxide (MnOx). In other embodiments, the barrier layer 200 may include CrOx, VOx, TiOx, and/or NbOx; however, the composition depends on the type of copper alloy used in the copper plug 180.

Figure 8:
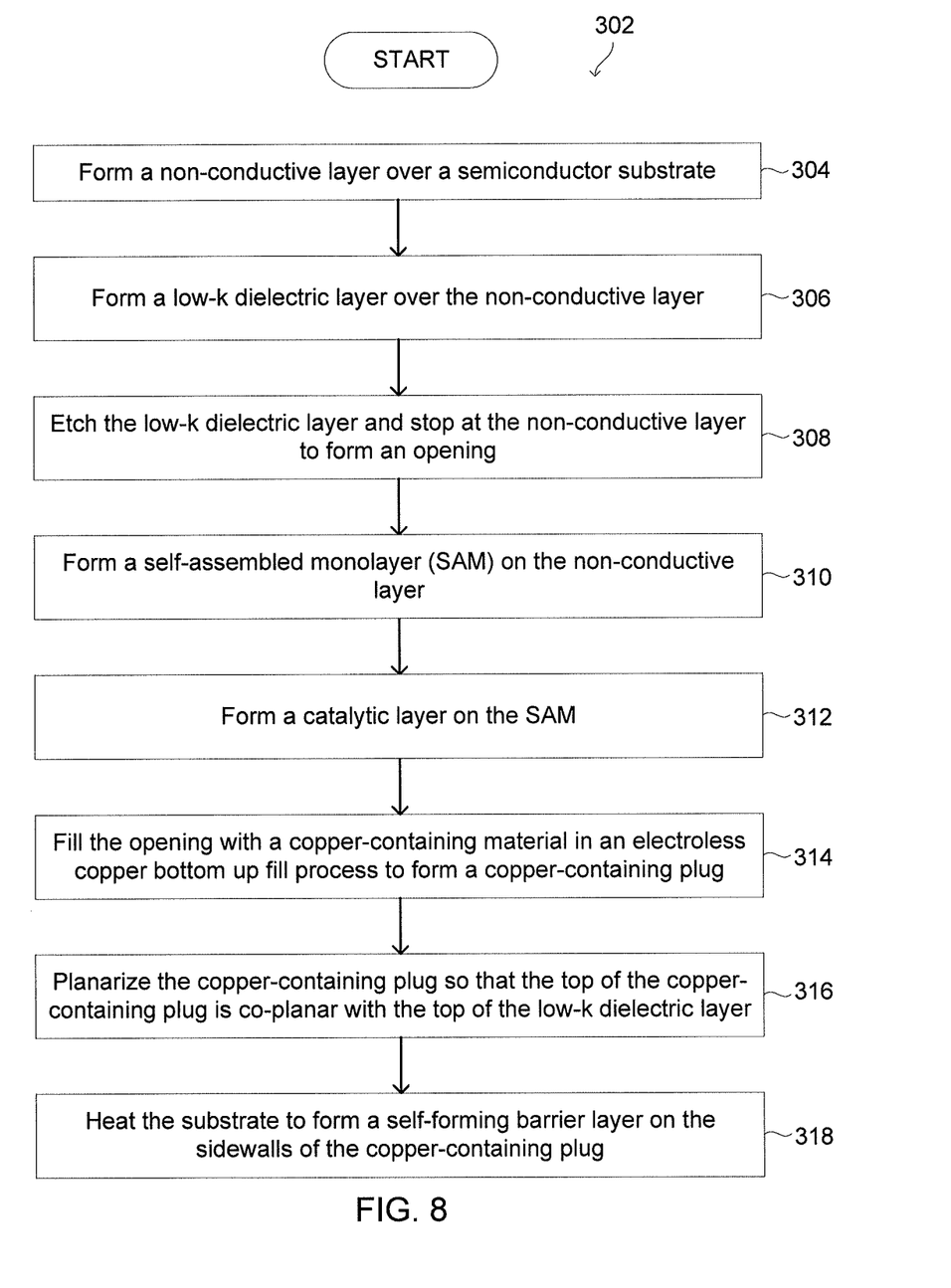
FIG. 8 is a flowchart of a method of fabricating a semiconductor device according to one embodiment of the present disclosure.

FIG. 8 is a flowchart of a method 302 of fabricating a semiconductor device according to another embodiment of the present disclosure. Referring to FIG. 8, the method 302 includes block 304, in which a non-conductive layer is formed over a semiconductor substrate. The method 302 includes block 306, in which a low-k dielectric layer is formed over the non-conductive layer. The method 302 includes block 308, in which the low-k dielectric layer is etched the etching stopping at the non-conductive layer to form an opening. The method 302 includes block 310, in which a self-assembled monolayer (SAM) is formed on the non-conductive layer. The method 302 includes block 312, in which a catalytic layer is formed on the SAM. The method 302 includes block 314, in which the opening is filled with a copper-containing material in an electroless copper bottom fill process to form a copper-containing plug. The method 302 includes block 316, in which the copper containing plug is planarized so that the top of the copper containing plug is co-planar with the top of the low-k dielectric layer. The method 302 includes block 318, in which the substrate is heated to form a self-forming barrier layer on the sidewalls of the copper containing plug.

Figure 9:
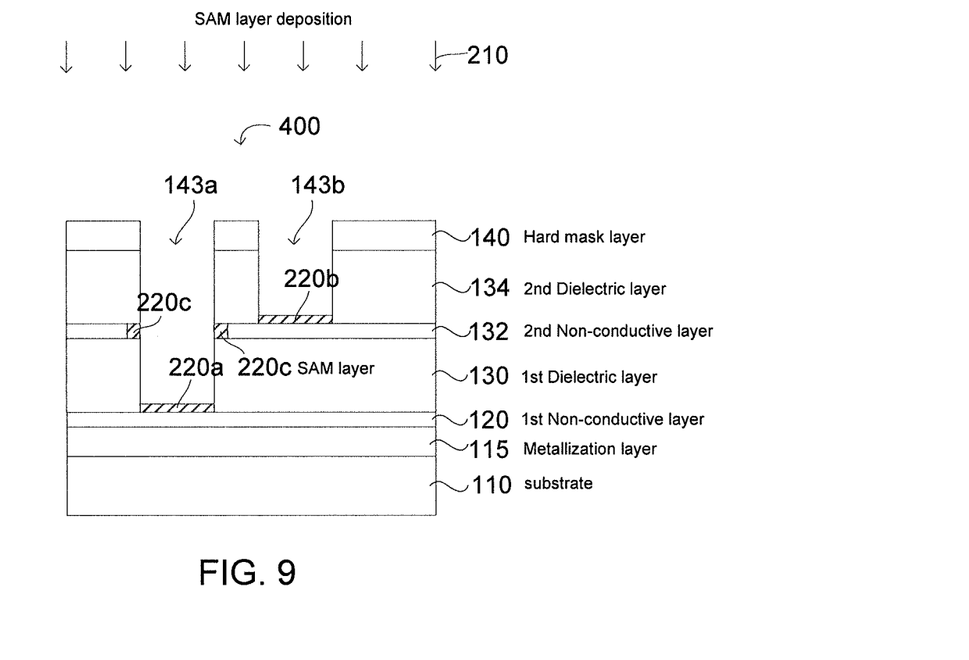
FIGS. 9-13 are diagrammatic cross-sectional side views of a portion of a semiconductor device at various stages of fabrication according to another embodiment of the present disclosure.

FIGS. 9-13 are diagrammatic cross-sectional side views of a portion of a semiconductor device at various stages of fabrication according to one embodiment of the method 302 of FIG. 8. FIG. 9 shows the semiconductor device 400 (similar to the semiconductor device 100 in FIG. 3 but with the addition of a self assembled monolayer (SAM) deposited in first opening 143a and second opening 143b). Specifically, a SAM layer 220a is deposited on the first non-conductive layer 120 within the first opening 143a; a SAM layer 220b is deposited on the second non-conductive layer 132 within the second opening 143b; and SAM layers 220c are deposited on the second non-conductive layer 132 within the first opening 143a. The SAM is a short carbon chain structure. In an exemplary embodiment, the SAM structure has around 2 to 10 units carbon and two different functional groups on two sides. One side has, as an example a Si—OH functional group that bonds with the non-conductive layers 120 and 132, and the other side has, as an example a —NH2 functional group that bonds with catalytic layer elements such as Co, Pd, Ru, and Ni found in later formed catalytic layers 240a, 240b, and 240c (see FIG. 10). The SAM may be deposited via spin-on coating from a solution containing solvents such as, for example hexane and SAM monomer.

Figure 10:
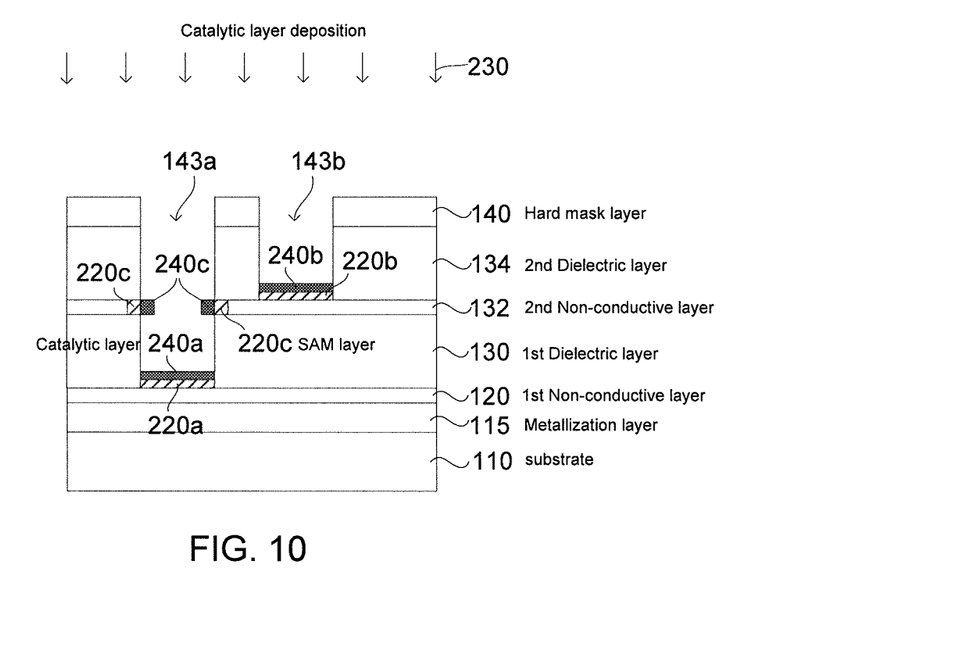

Referring now to FIG. 10, a catalytic layer deposition 230 is performed on the semiconductor device 400. A catalytic layer is deposited on the surfaces of the SAM. In the embodiment shown in FIG. 10, a catalytic layer 240a is deposited on SAM layer 220a; a catalytic layer 240b is deposited on SAM layer 220b; and catalytic layers 240c are deposited on SAM layers 220c. The catalytic layers 240a, 240b, and 240c include a material selected from the group consisting of Co, Pd, Ru, Ni, and combinations thereof and are formed over the respective ones of the SAM by chemical bonding, for example.

Figure 11:
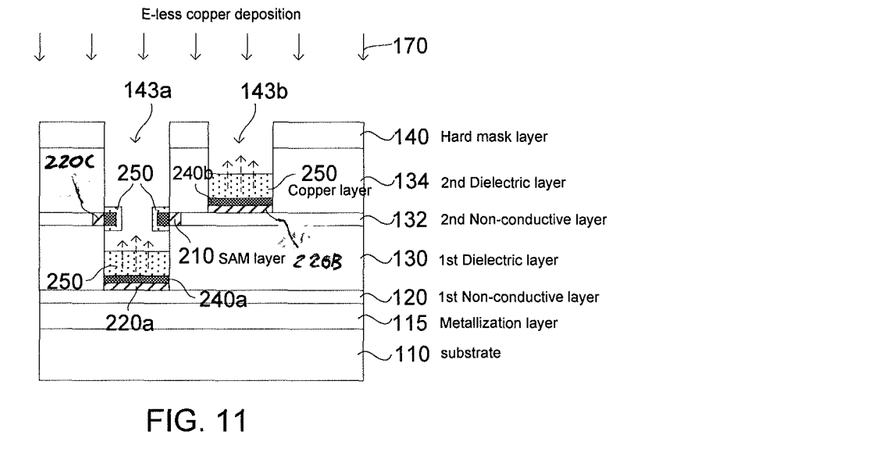

With reference to FIG. 11, a damascene deposition process 170 is performed on the semiconductor device 400. The damascene deposition process 170 deposits a conductive material on the catalytic layers 240a, 240b, and 240c in openings 143a and 143b. In one embodiment, the damascene deposition process 170 includes an electroless copper bottom-up fill process. With conventional copper deposition processes, the top portion of the opening may be blocked, thereby creating a void underneath the opening that may degrade the performance of the semiconductor device. In an electroless copper bottom up fill process, the void is avoided.

Figure 12:
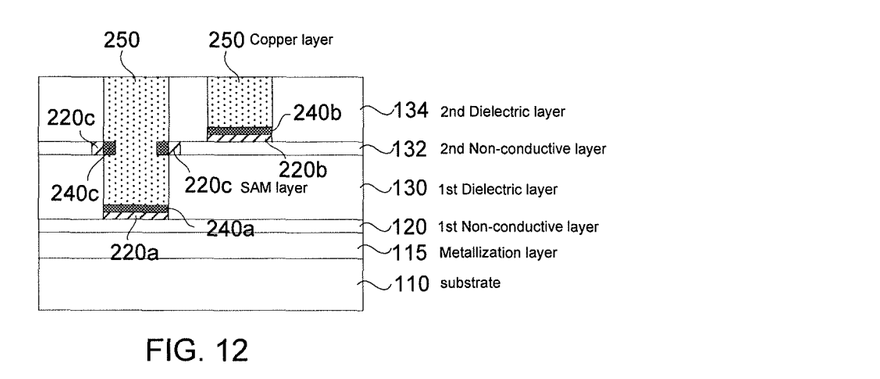

In the electroless copper bottom-up fill process, the process includes contacting first opening 143a and second opening 143b with an electroless plating bath and allowing electroless deposition of a conductive material on the catalytic layers to proceed for a predetermined time. One skilled in the art understands the composition of the electroless plating bath for copper filling and that it may include, for example a reducing agent, a surfactant, and a source of copper ions. In one embodiment, the electroless plating bath includes metal sources, reducing agents, complex agents, buffer agents, additives and the conductive material includes one of CuMn, CuCr, CuV, CuTi, and/or CuNb. According to one embodiment, the openings 143a and 143b are subject to the electroless plating bath for a period from about 10 seconds to about 500 seconds. Thereafter, the substrate is removed from the electroless plating bath. The process of contacting the openings to the electroless plating bath and removing the substrate therefrom is repeated to at least partially fill the openings 143a and 143b with a conductive material. As a result of the damascene deposition process 170, copper-containing plugs 250 are formed in the openings 143a and 143b. A planarization step using, for example a chemical mechanical polishing (CMP) process is subsequently performed after the damascene deposition process 170 to planarize the copper-containing plugs 250 so that the top thereof is co-planar with the top of the second low-k dielectric layer 134. The semiconductor device 400 after the step of planarization is shown in FIG. 12.

Figure 13:
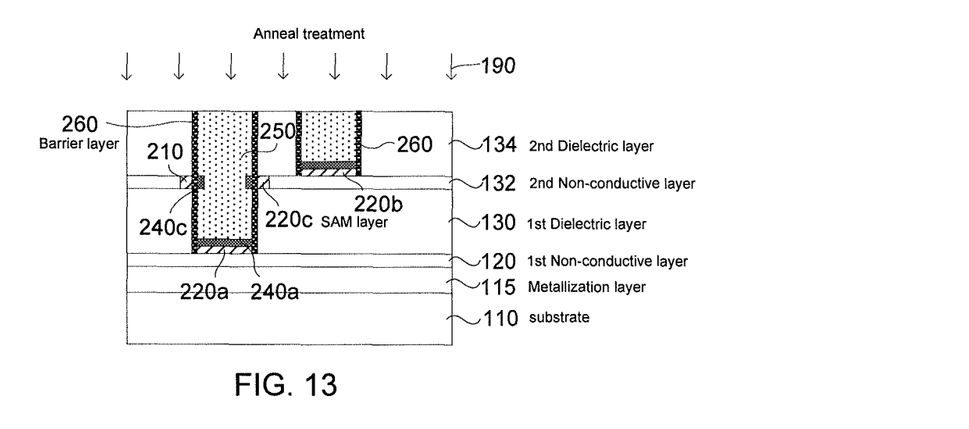

FIG. 13 shows a self-forming barrier layer 260 formed on the sidewalls of the copper-containing plugs 250. The self-forming barrier layer 260 includes metals and is electrically conductive but does not permit inter-diffusion and reactions between the copper-containing plugs 250 and the surrounding dielectric layer, such as first dielectric layer 130 and second dielectric layer 134. In one embodiment, an anneal treatment 190 is applied to the substrate to form a self-forming barrier 260 wrapping over the copper-containing plugs 250. The anneal treatment may be a rapid thermal anneal (RTA), a laser anneal, and/or a flash lamp anneal. The anneal process may be conducted in an oxygen ambient, a combination of steam ambient and oxygen ambient combined, or under an inert gas atmosphere.

The semiconductor devices with copper damascene shown in FIGS. 2-7 and 9-13 are only for illustrative purpose and are not limiting. Additional embodiments can be conceived.

The present disclosure has described various exemplary embodiments. According to one embodiment, a method of fabricating a semiconductor device includes forming a non-conductive layer over a semiconductor substrate. A low-k dielectric layer is formed over the non-conductive layer. The low-k dielectric layer is etched and stopped at the non-conductive layer to form an opening. A plasma treatment is performed on the substrate to convert the non-conductive layer within the opening into a conductive layer. The opening is filled with a copper-containing material in an electroless copper bottom up fill process to form a copper-containing plug. The copper-containing plug is planarized so that the top of the copper-containing plug is co-planar with the top of the low-k dielectric layer. The substrate is heated to form a self-forming barrier layer on the sidewalls of the copper-containing plug.

According to another embodiment, a method of fabricating a semiconductor device includes forming a non-conductive layer over a semiconductor substrate. A low-k dielectric layer is formed over the non-conductive layer. The low-k dielectric layer is etched and stopped at the non-conductive layer to form an opening. A self-assembled monolayer (SAM) is formed on the non-conductive layer. A catalytic layer is formed on the SAM. The opening is filled with a copper-containing material in an electroless copper bottom up fill process to form a copper-containing plug. The copper-containing plug is planarized so that the top of the copper-containing plug is co-planar with the top of the low-k dielectric layer. The substrate is heated to form a self-forming barrier layer on the sidewalls of the copper-containing plug.

According to yet another embodiment, a method of fabricating a damascene layer includes forming a first non-conductive layer over a semiconductor substrate. A first low-k dielectric layer is formed over the first non-conductive layer. A second non-conductive layer is formed over the first low-k dielectric layer. A second low-k dielectric layer is formed over the second non-conductive layer. The first low-k dielectric layer is etched and stopped at the first non-conductive layer to form a first opening and the second low-k dielectric layer is etched and stopped at the second non-conductive layer to form a second opening. A plasma treatment is performed on the substrate to convert the first non-conductive layer within the first opening into a first conductive layer and the second non-conductive layer within the second opening into a second conductive layer. The first and second openings are filled with a copper-containing material in an electroless copper bottom up fill process to form a first copper-containing plug and a second copper-containing plug, respectively. The first and second copper-containing plugs are planarized so that the tops of the plugs are co-planar with the top of the second low-k dielectric layer. The substrate is heated to form a self-forming barrier layer on the sidewalls of the first and second copper-containing plugs.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of fabricating a semiconductor device, comprising:

forming a non-conductive layer over a semiconductor substrate;

forming a low-k dielectric layer over the non-conductive layer;

etching the low-k dielectric layer and stopping at the non-conductive layer to form an opening;

heating the substrate to convert the non-conductive layer within the opening into a conductive layer;

filling the opening with a copper-containing material to form a copper-containing plug;

planarizing the copper-containing plug so that a top of the copper-containing plug is co-planar with a top of the low-k dielectric layer; and heating the substrate to form a self-forming barrier layer on sidewalls of the copper-containing plug.

2. The method of claim 1, wherein the non-conductive layer includes a material selected from the group consisting of TaN, TaSiN, TaC, TiN, TiSiN, AlON, AlN, and AlO.

3. The method of claim 1, wherein the non-conductive layer is formed over the substrate by CVD or ALD.

4. The method of claim 1, wherein the opening is a dual damascene opening.

5. The method of claim 1, wherein converting the non-conductive layer within the opening into a conductive layer comprises performing a plasma treatment on the substrate.

6. The method of claim 5, wherein the plasma treatment is performed at a temperature ranging between about 20 Celsius and about 400 Celsius, at a pressure ranging between about 0.01 torr and about 100 torr at a power ranging between about 50 watts and about 500 watts, and a time of between 3 seconds and 30 seconds.

7. The method of claim 1, wherein filling the opening with a copper-containing material comprises an electroless copper bottom up fill process.

8. The method of claim 5, wherein the plasma treatment is performed with a gas selected from the group consisting of Ar, $H_2$, He, Ne, and a combination thereof.

9. A method of fabricating a damascene layer, comprising:
   forming a first non-conductive layer over a semiconductor substrate;
   forming a first low-k dielectric layer over the first non-conductive layer;
   forming a second non-conductive layer over the first low-k dielectric layer;
   forming a second low-k dielectric layer over the second non-conductive layer;
   etching the first low-k dielectric layer and stopping at the first non-conductive layer to form a first opening and etching the second low-k dielectric layer and stopping at the second non-conductive layer to form a second opening;
   heating the substrate to convert the first non-conductive layer within the first opening into a first conductive layer and the second non-conductive layer within the second opening into a second conductive layer;
   filling the first opening and the second opening with a copper-containing material to form a first copper-containing plug and a second copper-containing plug, respectively;
   planarizing the first and second copper-containing plugs so that tops of the plugs are co-planar with a top of the second low-k dielectric layer; and
   heating the substrate to form a self-forming barrier layer on sidewalls of the first and second copper-containing plugs.

10. The method of claim 9, wherein the first and second non-conductive layers include a material selected from the group consisting of TaN, TaSiN, TaC, TiN, TiSiN, AlON, AlN, and AlO.

11. The method of claim 9, wherein the first and second non-conductive layers are formed by CVD or ALD.

12. The method of claim 9, wherein the step of heating the substrate to convert the first non-conductive layer within the first opening into a first conductive layer and the second non-conductive layer within the second opening into a second conductive layer includes performing a plasma treatment with a gas selected from the group consisting of Ar, H2, He, Ne, and a combination thereof.

13. The method of claim 12, wherein the plasma treatment is performed at a temperature ranging between about 20 Celsius and about 400 Celsius, at a pressure ranging between about 0.01 torr and about 100 torr at a power ranging between about 50 watts and about 500 watts, and a time of between 3 seconds and 30 seconds.

14. A method of fabricating a semiconductor device, comprising:
   forming a first metallization layer over a semiconductor substrate;
   forming a first non-conductive layer over the first metallization layer;
   forming a first low-k dielectric layer over the non-conductive layer, a second non-conductive layer over the first low-k dielectric layer, and a second low-k dielectric layer over the second non-conductive layer;
   etching a first opening, the first opening extending through the a second low-k dielectric layer, second non-conductive layer, and the first low-k dielectric layer, and exposing a portion of the first non-conductive layer;
   etching a second opening, the second opening extending through the a second low-k dielectric layer and exposing a portion of the second non-conductive layer;
   applying a heat treatment to convert the exposed portion of the first non-conductive layer to a first conductive portion and to convert the exposed portion of the second non-conductive layer to a second conductive portion;
   filling the first opening with a conductive material and filling the second opening with conductive material; and
   heating the device to form a self-forming barrier layer on sidewalls of the conductive material.

15. The method of claim 14, wherein the conductive material includes an alloy of copper and an alloying metal and wherein the step of heating the device to form a self-forming barrier layer on sidewalls of the conductive material includes forming an oxide of the alloying metal on sidewalls of the conductive material.

16. The method of claim 14, wherein the heat treatment is selected from the group consisting of a plasma treatment, an anneal, a pulsed energy beam, and combinations thereof.

17. The method of claim 14, wherein the first non-conductive Layer comprises a compound selected from the group consisting of TaN, TaSiN, TaC, TiN, TiSiN, AlON, AlN, and AlO.

18. The method of claim 14, wherein the conductive material includes a plug formed of copper and an alloying metal, and wherein the step of heating the device to form a self-forming barrier layer on sidewalls of the conductive material causes the alloying metal to segregate from the copper and migrate to surfaces of the plug.

19. The method of claim 18, wherein the step of heating the device to form a self-forming barrier layer on sidewalls of the conductive material is performed in an oxygen containing environment, and wherein segregated alloying metal combines with oxygen in the oxygen containing environment.

* * * * *